(12) United States Patent
Lee

(10) Patent No.: US 8,773,855 B2
(45) Date of Patent: Jul. 8, 2014

(54) HEAT-DISSIPATING DEVICE AND ELECTRIC APPARATUS HAVING THE SAME

(75) Inventor: Sang-Cheol Lee, Gyeonggi-do (KR)

(73) Assignee: Zaonzi Co., Ltd., Seoul (KR)

( * ) Notice: Subject to any disclaimer, the term of this patent is extended or adjusted under 35 U.S.C. 154(b) by 293 days.

(21) Appl. No.: 13/300,764

(22) Filed: Nov. 21, 2011

(65) Prior Publication Data

US 2012/0063092 A1    Mar. 15, 2012

Related U.S. Application Data

(63) Continuation of application No. PCT/KR2010/003727, filed on Jun. 10, 2010.

(30) Foreign Application Priority Data

Jun. 11, 2009  (KR) .......................... 10-2009-0051972

(51) Int. Cl.
   *H05K 7/20* (2006.01)
   *G06F 1/20* (2006.01)

(52) U.S. Cl.
   USPC ...... 361/700; 361/679.52; 361/704; 361/719; 165/104.21; 165/104.26; 165/185

(58) Field of Classification Search
   USPC ....................... 361/679.52, 679.54, 700, 704; 165/104.2, 104.26, 185; 174/15.2
   See application file for complete search history.

(56) References Cited

U.S. PATENT DOCUMENTS

| D484,468 | S | * | 12/2003 | Lee | ............................. D13/179 |
| D484,854 | S | * | 1/2004 | Lee | ............................. D13/179 |
| D484,855 | S | * | 1/2004 | Lee | ............................. D13/179 |
| D485,241 | S | * | 1/2004 | Lee | ............................. D13/179 |

(Continued)

FOREIGN PATENT DOCUMENTS

| DE | 102006011528 A1 * | 9/2007 | ............. F28D 15/02 |
| JP | 1991110391 A | 5/1991 | |

(Continued)

OTHER PUBLICATIONS

PCT International Search Report dated Jan. 6, 2011 received in corresponding PCT Application No. PCT/KR2010/003727, 5 pgs.

(Continued)

*Primary Examiner* — Robert J Hoffberg
(74) *Attorney, Agent, or Firm* — Grossman Tucker Perreault & Pfleger, PLLC

(57) ABSTRACT

A heat-dissipating device and an electronic apparatus having the same are disclosed. The heat-dissipating device includes a heat-transferring heat pipe unit having a wick type of a heat pipe, in which a wick is formed on an inner surface of the heat pipe and a working fluid is injected into the heat pipe, and a heat-dissipating heat pipe unit having an oscillating capillary type of a loop heat pipe, in which the loop heat pipe is formed as a capillary and a working fluid is injected into the loop heat pipe. Here, the heat pipe includes a radiator being disposed adjacent to a heat source and transporting heat transferred from the heat source to the loop heat pipe, and the loop heat pipe includes a heat-receiving portion, which is thermally coupled to the radiator, and a heat-dissipating portion, which releases heat absorbed from the heat-receiving portion.

20 Claims, 18 Drawing Sheets

(56) References Cited

U.S. PATENT DOCUMENTS

| | | | |
|---|---|---|---|
| 7,515,417 B2 * | 4/2009 | Lee et al. ................. 361/700 |
| 2006/0011329 A1 | 1/2006 | Wang et al. |
| 2006/0102324 A1 | 5/2006 | Mok et al. |
| 2006/0108103 A1 | 5/2006 | Yu et al. |
| 2010/0212865 A1 * | 8/2010 | Lee ........................ 165/104.19 |
| 2012/0198695 A1 * | 8/2012 | Lee ........................ 29/890.032 |
| 2012/0314415 A1 * | 12/2012 | Lee ........................ 362/249.02 |
| 2013/0044433 A1 * | 2/2013 | Lee ........................ 361/700 |
| 2013/0306123 A1 * | 11/2013 | Lee ........................ 136/205 |

FOREIGN PATENT DOCUMENTS

| | | | | |
|---|---|---|---|---|
| JP | 04-023456 | * | 1/1992 | ............ H01L 23/427 |
| JP | 199223456 A | | 1/1992 | |
| JP | 199714875 A | | 1/1997 | |
| JP | 1997329394 A | | 12/1997 | |
| JP | 11183065 | | 7/1999 | |
| JP | 2000277963 A | | 10/2000 | |
| JP | 2001289579 A | | 10/2001 | |
| JP | 1997324991 B2 | | 11/2002 | |
| JP | 2009216343 A | | 9/2009 | |
| KR | 10-1060658 B1 | * | 12/2008 | ............ F28D 15/02 |
| KR | 10-1180494 B1 | * | 3/2011 | ............ H05K 7/20 |
| WO | 2009048218 A1 | | 4/2009 | |
| WO | WO 2009088135 A1 | * | 7/2009 | ............ H01L 23/427 |
| WO | WO 2013137493 A1 | * | 9/2013 | ............ F21S 2/00 |

OTHER PUBLICATIONS

PCT Written Opinion dated Jan. 6, 2011 received in corresponding PCT Application No. PCT/KR2010/003727, 3 pgs.

Japanese Office Action dated Nov. 26, 2013, received in corresponding JP Application No. 2012-514884, with English language summary.

Japanese Office Action dated Feb. 26, 2013, received in corresponding JP Application No. 2012-514884, with English language summary.

* cited by examiner

HEAT-DISSIPATING DEVICE AND ELECTRIC APPARATUS HAVING THE SAME

CROSS-REFERENCE TO RELATED APPLICATIONS

This application is a continuation of PCT/KR2010/003727 filed Jun. 10, 2010, which claims the benefit of Korean Patent Application No. 10-2009-0051972, filed with the Korean Intellectual Property Office on Jun. 11, 2009, the disclosure of which is incorporated herein by reference in its entirety.

BACKGROUND

1. Technical Field

The present invention relates to a heat-dissipating device and an electronic apparatus having the heat-dissipating device.

2. Description of the Related Art

Generally, electronic components, such as the central processing unit (CPU) of a computer, the chipset of a video card, power transistors, and light-emitting diodes (LEDs), generate heat during the operation. If the electronic component overheats, it may malfunction or be damaged, and thus a heat-dissipating device may be essentially required to prevent the electronic component from overheating.

Typically, by dissipating the heat generated in a heat source, the heat-dissipating device can prevent the heat source such as the electronic component from overheating.

An example of the heat-dissipating device employed in the electronic component is the conventional pin-structured heat-dissipating device.

However, with the conventional pin-structured heat-dissipating device, it is difficult to maintain the surface area of the heat transfer pins wide while electronic components that are becoming smaller require that the size of heat-receiving portions be smaller. Even if the surface area of the heat transfer pins is made wider, the distance between the heat-receiving portions and heat-dissipating portions becomes greater, leading to slower heat transfer and thus limiting the improvement of heat dissipating efficiency.

It is also difficult to apply the conventional heat transfer pins in a large-size heat source, such as the RF modulator, because of the restricted size of the heat transfer pins, which are commonly extrusion-molded, of the conventional heat-dissipating device. Moreover, the pin-structured heat-dissipating device used in a large heat source has thicker heat transfer pins due to the consideration of structural stability and heat dissipating efficiency, hindering the reduction of weight and increasing the manufacturing costs.

To complement these limits, the conventional heat-dissipating device may further include a high-speed heat dissipating fan. However, adding the heat dissipating fan also causes a problem of noise and increased power consumption.

SUMMARY

The present invention provides a heat-dissipating device that has a high heat transfer performance and a high efficiency in dissipating heat and an electronic apparatus equipped with the heat-dissipating device.

The present invention also provides a heat-dissipating device that can be applied to a large heat source and an electronic apparatus equipped with the heat-dissipating device.

Furthermore, the present invention provides a heat-dissipating device that operates without noise or with little noise.

An aspect of the present invention provides a heat-dissipating device that includes a heat-transferring heat pipe unit having a wick type of a heat pipe, in which a wick is formed on an inner surface of the heat pipe and a working fluid is injected into the heat pipe, and a heat-dissipating heat pipe unit having an oscillating capillary type of a loop heat pipe, in which the loop heat pipe is formed as a capillary and a working fluid is injected into the loop heat pipe. Here, the heat pipe includes a radiator being disposed adjacent to a heat source and transporting heat transferred from the heat source to the loop heat pipe, and the loop heat pipe includes a heat-receiving portion and a heat-dissipating portion, in which the heat-receiving portion is thermally coupled to the radiator and the heat-dissipating portion releases heat absorbed from the heat-receiving portion.

The heat-dissipating device can further include a heat transfer block having a base. One surface of the base is in contact with a heat source, and the other surface of the base having a holding groove formed therein is for the heat pipe.

The loop heat pipe can have a spirally shaped structure.

The heat-dissipating heat pipe unit can include an outer loop heat pipe, which is disposed on an outer side, and at least one inner loop heat pipe, which surrounds an inner circumference of the outer loop heat pipe in such a way that the inner loop heat pipe is separated from the outer loop heat pipe. The heat-transferring heat pipe unit can include at least one heat pipe, which is coupled to the inner and outer loop heat pipes.

The inner and outer loop heat pipes can be formed in the shape of a circular loop or a rectangular loop.

The heat-dissipating device can further include a heat-dissipating fan, which is disposed on one side of the heat-dissipating heat pipe unit and enables circulation of air through an inner space of the loop heat pipe.

The heat-dissipating heat pipe unit can include a loop heat pipe. Here, the loop heat pipe is disposed in the shape of a ring so as to form a radially disposed heat-dissipating portion.

The heat-transferring heat pipe unit can include a heat pipe having a ring-shaped radiator, and the heat-dissipating heat pipe unit can include a pair of ring-shaped loop heat pipes, which are coupled to an inner side and an outer side of the ring-shaped radiator, respectively.

The pair of ring-shaped loop heat pipes can be formed in such a way that a distance between circles of the ring-shaped loop heat pipes become wider from one side to the other side. Here, the one side is coupled to the ring-shaped radiator.

The heat-dissipating heat pipe unit can include a plurality of loop heat pipes being disposed in a radial direction.

The heat-transferring heat pipe unit can include at least one heat pipe having radiators, in which the radiators are arranged symmetrically, and the heat-dissipating heap pipe unit can include a pair of loop heat pipes, in which the pair of loop heat pipes are coupled to the symmetrically arranged radiators interchangeably and are partly overlapped with each other.

Another aspect of the present invention provides an electronic apparatus that includes a substrate, which has a heat source mounted thereon, a case, which has the substrate installed therein, and a heat-dissipating device, which is coupled to the heat source.

In the heat-dissipating device, the heat-transferring heat pipe unit can include multiple pairs of radiators, and the heat-dissipating heat pipe unit can include multiple pairs of unit loop heat pipes, which are arranged in parallel.

The electronic apparatus can further include a partition. Here, the partition is installed in the case so as to divide an inner space of the case, the substrate is installed on one surface of the partition, and the heat-dissipating heat pipe unit is installed on the other surface of the partition.

Additional aspects and advantages of the present invention will be set forth in part in the description which follows, and in part will be obvious from the description, or may be learned by practice of the invention.

DETAILED DESCRIPTION

Figure 1:
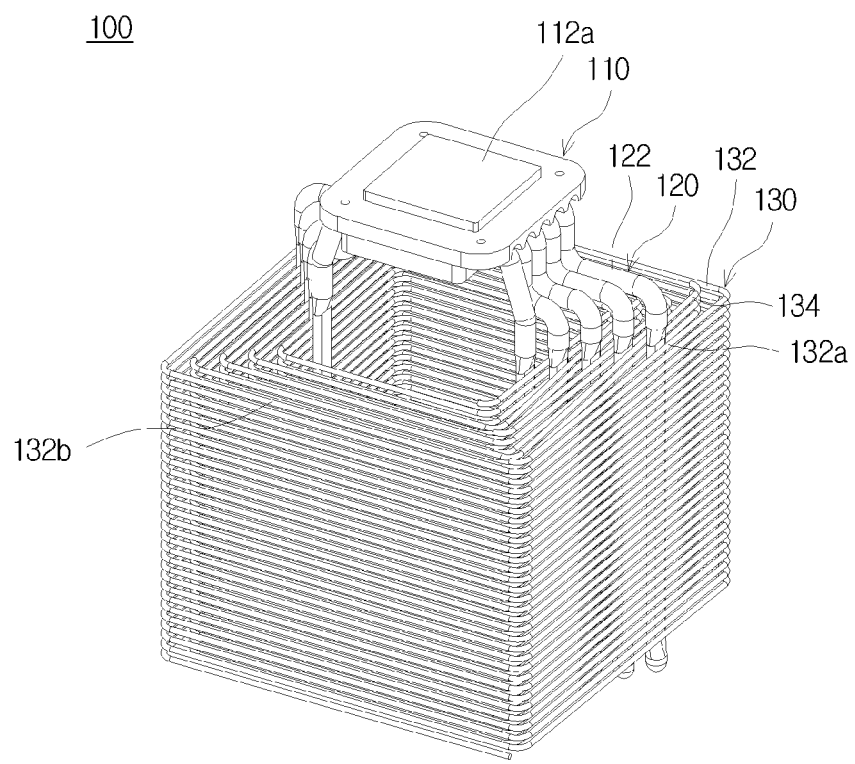
FIG. 1 is a perspective view illustrating a heat-dissipating device in accordance with a first disclosed embodiment of the present invention.

A heat-dissipating device according to certain embodiments of the present invention will be described below in more detail with reference to the accompanying drawings. Those components that are the same or are in correspondence are rendered the same reference numeral regardless of the figure number, and redundant descriptions are omitted.

Figure 2:
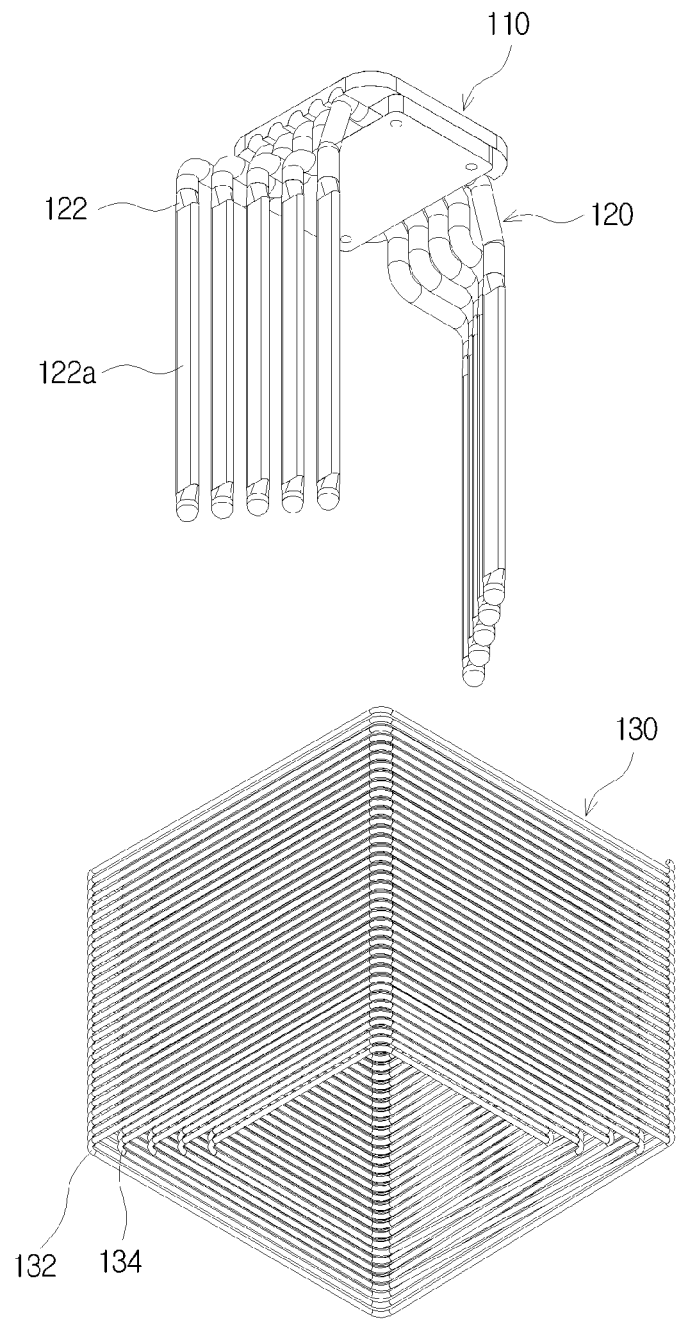
FIG. 2 is an exploded view illustrating a heat-dissipating device in accordance with the first disclosed embodiment of the present invention.

FIG. 1 is a perspective view illustrating a heat-dissipating device 100 in accordance with a first disclosed embodiment of the present invention. FIG. 2 is an exploded view illustrating the heat-dissipating device 100 in accordance with the first disclosed embodiment of the present invention.

The heat-dissipating device 100 according to the first disclosed embodiment of the present invention includes a heat-transferring heat pipe unit 120, which transfers heat from a heat source, and a heat-dissipating heat pipe unit 130, which dissipates the heat transferred from the heat source. Here, the heat-transferring heat pipe unit 120, which is equipped with a wick-type heat pipe 122, can quickly transfer a large quantity of heat to the heat-dissipating heat pipe unit 130, and the heat-dissipating heat pipe unit 130, which is equipped with an oscillating capillary-type loop heat pipe 132, can dissipate the transferred heat through the large surface area, and thus the heat-dissipating device 100 according to this embodiment can provide high efficiency in dissipating the heat.

In other words, the wick-type heat pipe 122 itself may not provide a high efficiency in dissipating heat due to its limited heat releasing surface area, even though it has the ability to quickly transfer a large quantity of heat from a relatively small heat source. By combining an oscillating capillary-type loop heat pipe 132, which can quickly release a large quantity of heat through its large surface area, with the wick-type heat pipe 122, the heat-dissipating device 100 can provide high efficiency in dissipating the heat.

The heat-transferring heat pipe unit 120 is a part that removes heat from the heat source and move it to the heat-dissipating heat pipe unit 130, which will be described later. In particular, the heat-transferring heat pipe unit 120 is equipped with the wick-type heat pipes 122, which are placed close to the heat source, so as to quickly transfer a large quantity of heat.

The wick-type heat pipe 122 is constituted by a sealed pipe, into which a working fluid is sealed, a wick, which is placed on the inner wall of the pipe and through which the working fluid can be moved, and a vapor moving space, which is formed inside the pipe and through which the vaporized working fluid can be moved. Looking at a more detailed function of the wick-type heat pipe 122, a working fluid vaporized at an area where heat is transferred from a heat source can naturally flow to a radiator 122a, which transfers the heat to the outside, through the vapor moving space. After that, the vaporized working fluid at the radiator 122a can be naturally condensed on a cold surface, allowing the heat of vaporization to be transferred to the radiator 122a. The condensed working fluid is moved back to its original place through the wick so as to evaporate again and repeat the cycle. This results in a heat-transferring cycle that can transfer heat to the radiator 122a.

The wick-type heat pipe 122 having a heat-transferring structure, which has been described above, has a tube that has a relatively wider diameter than a loop heat pipe 132, which will be described later, and thus can be injected with a large quantity of working fluid. As a result, a large quantity of heat can be transferred quickly to the radiator 122a by the cycle or process of evaporation and condensation of a large quantity of working fluid. Therefore, the heat-transferring heat pipe unit 120 can provide high efficiency in dissipating the heat by quickly transferring the heat generated from a heat source to the heat-dissipating heat pipe unit 130 so as to prevent the heat from becoming stuck.

In a heat-dissipating device according to this embodiment, at least one heat pipe 122 is connected to the loop heat pipe 132 so as to transfer the heat of the heat-transferring heat pipe unit 120 to the heat-dissipating heat pipe unit 130. In a more detailed example, a heat pipe 122 and a loop heat pipe 132 in accordance with the present embodiment are coupled to each other, allowing an one-to-one match between them. However, this embodiment can be also implemented using a plurality of heat pipes being coupled to a single loop heat pipe, but it is apparent that the present invention is not thus limited. In another example, this embodiment can be implemented using a single heat pipe being coupled to a plurality of loop heat pipes.

As in the example illustrated in FIG. 2, a heat-transferring heat pipe unit 120 according to this embodiment includes a plurality of wick-type heat pipes 122 that penetrate through a heat transfer block 110, which will be described later, where the center portion of each of the plurality of wick-type heat pipes 122 is coupled to the heat transfer block 110. Also, as illustrated in FIG. 1, a radiator 122a placed on either side of the center portion of each heat pipe 122 is coupled to the loop heat pipe 132.

Here, the plurality of heat pipes 122 can be disposed in direct contact with the loop heat pipe 132 by way of soldering or brazing so that the plurality of heat pipes 122 can be thermally joined to the loop heat pipe 132.

Here, the heat source and the heat-transferring heat pipe unit 120 can be coupled to each other by way of a heat transfer block 110 such that the heat source and the heat-transferring heat pipe unit 120 can readily be coupled to each other.

The heat transfer block 110 is a part that receives heat generated by a heat source, for example, an electronic component. For this, one surface 112a of the heat transfer block 110 is formed in correspondence with the shape of the heat source such that the surface 112a can be in direct contact with the heat source. Also, the heat transfer block 110 is made of a material with high thermal conductivity, for example, copper or aluminum.

As illustrated in FIG. 1, one surface 112a of the heat transfer block 110 according to the present embodiment is formed flat such that the surface 112a can be in contact with one surface of an electronic component, for example, CPU.

Also, the heat transfer block 110 is coupled in direct contact with the heat pipes 122 of the heat-transferring heat pipe unit 120, which penetrates through the inside of the heat transfer block 110, such that the heat transfer block 110 can be thermally connected to the heat-transferring heat pipe unit 120.

Figure 3:
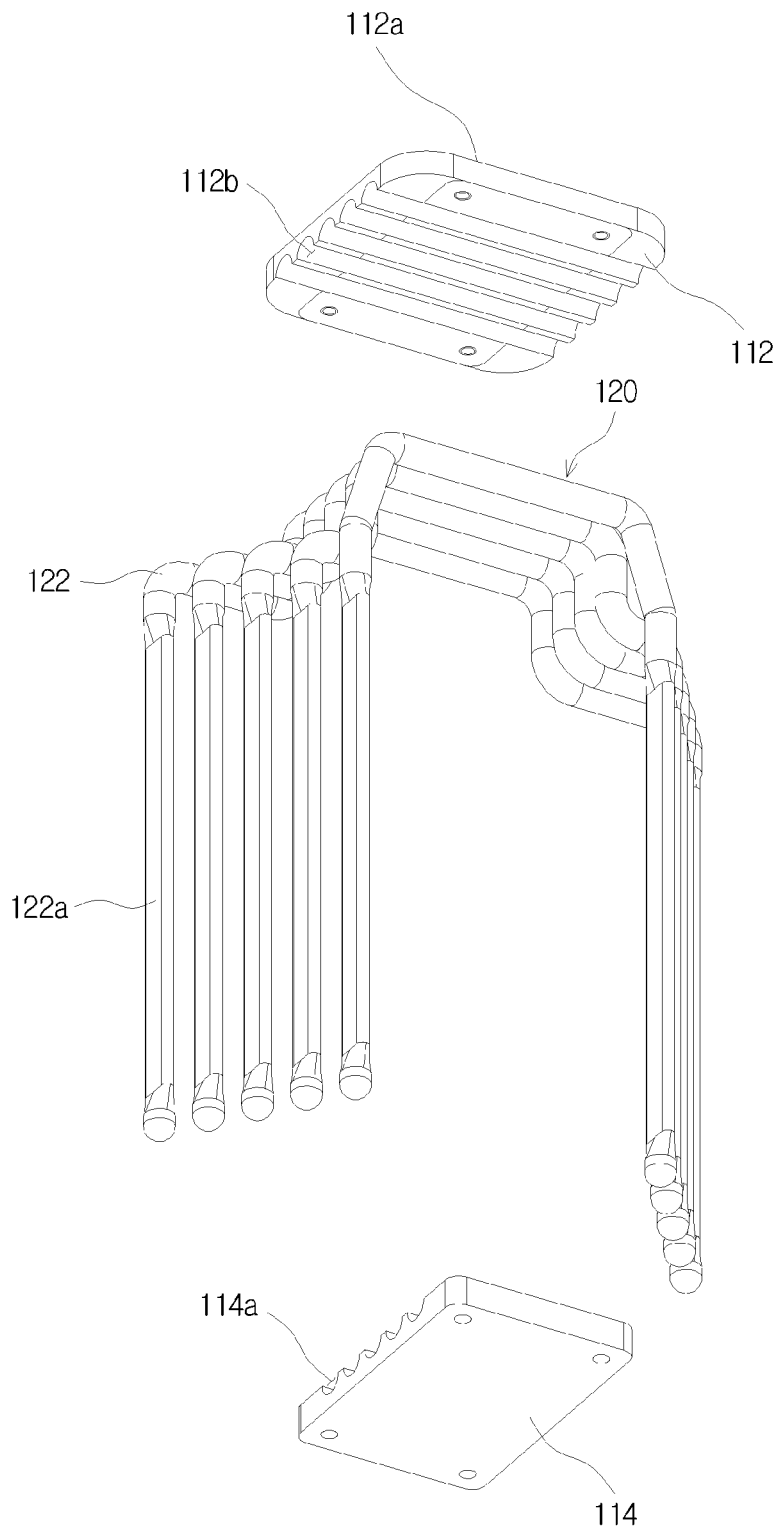
FIG. 3 is an exploded view of a heat transfer block in a heat-dissipating device in accordance with the first disclosed embodiment of the present invention.

FIG. 3 is an exploded view of the heat transfer block 110 in the heat-dissipating device 100 in accordance with the first disclosed embodiment of the present invention.

As illustrated in FIG. 3, the heat transfer block 110 according to this embodiment can include a base 112, of which one surface 112a is in direct contact with a heat source and the other surface has holding grooves 112b for the heat pipes 122 formed therein, and a cover 114, which is put on the other surface of the base 112 to cover the heat pipes 122 and which has covering grooves 114a shaped in correspondence with the holding grooves 112b. In this way, the heat pipes 122 can be interposed between the base 112 and the cover 114 and connected to one another. As a result, heat transferred to the heat transfer block 110 can be transferred to the heat-dissipating heat pipe unit 130 by the heat pipes 122 penetrating through the heat transfer block 110. While this embodiment presents the heat-transferring heat pipe unit 120 being coupled to a heat source by way of the heat transfer block 110, it shall be apparent that the present invention is not limited to this example. In another example, the heat pipes 122 of the heat-transferring heat pipe unit 120 can be coupled directly to the heat source.

The heat-dissipating heat pipe unit 130 is a part that is coupled thermally to the heat-transferring heat pipe unit 120 and dissipates the heat that is transferred through the heat-transferring heat pipe unit 120. Particularly, the heat-dissipating heat pipe unit 130 has an oscillating capillary-type loop heat pipe 132 so as to quickly release a large quantity of heat.

Figure 4:
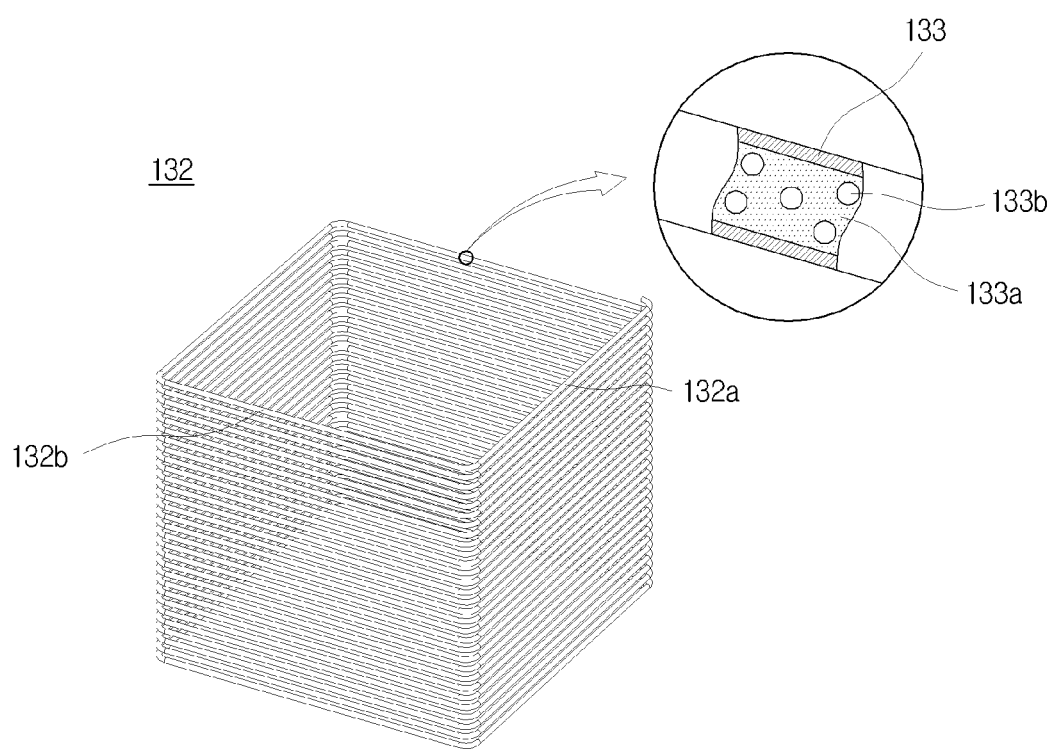
FIG. 4 is a perspective view of a loop heat pipe in a heat-dissipating device in accordance with the first disclosed embodiment of the present invention.

FIG. 4 is a perspective view of a loop heat pipe 132 in the heat-dissipating device 100 in accordance with the first disclosed embodiment of the present invention.

As in the example illustrated in FIG. 4, a loop heat pipe 132 includes a heat-receiving portion 132a and a heat-dissipating portion 132b, where a working fluid 133a with air bubbles 133b are injected into the heat-receiving portion 132a and the heat-dissipating portion 132b. As illustrated in FIG. 1, the heat-receiving portion 132a is placed adjacent to a radiator 122a of the heat pipes 122 transferring heat and receives the heat from the radiator 122a. Likewise, the heat-dissipating portion 132b is placed apart from the radiator 122a and releases the heat transferred from the heat-receiving portion 132a to the outside by being linked with the heat-receiving portion 132a.

In a more detailed example, a loop heat pipe 132 according to this embodiment is composed of an oscillating capillary-type heat pipe using the dynamic pressure of fluid.

As in the example illustrated in FIG. 4, the oscillating capillary-type heat pipe has a capillary tube 133, which is sealed after a predetermined quantity of a working fluid 133a is injected with air bubbles 133b into the capillary tube 133. In this way, the oscillating capillary-type heat pipe can have a closed-loop heat recirculation system that can transport a large quantity of heat in the form of latent heat due to the volume expansion and contraction of the working fluid 133a and the air bubbles 133b.

In the heat transfer mechanism of the oscillating capillary-type heat pipe, the air bubbles 133b in the heat-receiving portion 132a are expanded in volume as nucleate boiling occurs at the heat-receiving portion 132a corresponding to the amount of heat absorbed. At the same time, the air bubbles 133b in the heat-dissipating portion 132b decrease the volume by as much as the volume of the air bubbles 133b expanded in the heat-receiving portion 132a because the capillary tube 133 always maintains a fixed internal volume. Thus, the balance of pressure within the capillary tube 133 is disrupted, and thus the heat pipe comes with a movement, including the vibrations of the working fluid 133a and the air bubbles 133b. In this way, the oscillating capillary-type heat pipe can perform its heat dissipating function by allowing latent heat transportation that causes a rise or drop in temperature in its surroundings during the change of volume of the air bubbles 133b.

Here, the loop heat pipe 132 can include a capillary tube 133 made of a material with high thermal conductivity, for example, copper or aluminum. Thus, heat can quickly be conducted to the capillary tube 133, while the volume change of the air bubbles 133b, which are sealed in the capillary tube 133, can be stimulated within a very short time.

The loop heat pipe 132 can be implemented in both an open-loop structure and a closed-loop structure. Also, if there are a plurality of loop heat pipes 132 and 134, the entire or a portion of the loop heat pipe 132 can be connected to an adjacent loop heat pipe 134. Therefore, the plurality of loop heat pipes 132 and 134 can have an open-loop or closed-loop structure, depending on the design conditions.

Furthermore, the loop heat pipe 132 can be implemented in the form of a spiral. With the spiral structure of the capillary tube 133 that is wound around its central point at compact intervals, the long capillary tube 133 can be efficiently arranged in a limited space. Thus, the heat-receiving portion 132a and heat-dissipating portion 132b of the spiral structured loop heat pipe 132 can have a large surface area even in a limited space.

As in the example illustrated in FIG. 4, the loop heat pipe 132 according to this embodiment is formed in the shape of a rectangular-shaped spiral. Also, the capillary tube 133 forming the loop heat pipe 132 is formed with a narrower diameter than the heat pipe 122. Thus, as illustrated in FIG. 1, the capillary tube 133 making up the loop heat pipe 132 can be coupled at multiple points to the radiator 122a of the heat pipe 122. As a result, the surface area of the heat-receiving portion 132a of the loop heat pipe 132 can be significantly increased, allowing the loop heat pipe 132 to efficiently absorb a large quantity of heat transferred by way of the heat pipe 122.

In the spiral structured loop heat pipe 132, substantial portions of the capillary tube 133 that are arranged in parallel to one another at the radiator 122a become a heat-dissipating portion 132b. Therefore, the surface area of the heat-dissipating portion 132b of the loop heat pipe 132 can be significantly increased, allowing the loop heat pipe 132 to release its internal heat more efficiently to the outside.

As described above, the heat-dissipating heat pipe unit 130 according to this embodiment having a spiral-structured oscillating capillary-type loop heat pipe 132 can significantly increase the efficiency of absorbing and dissipating heat. Therefore, when the heat-transferring heat pipe unit 120 quickly transfer a large quantity of heat from the heat transfer block 110, the heat-dissipating heat pipe unit 130 can quickly release the heat to the outside.

Here, the heat-dissipating heat pipe unit 130 can include a plurality of loop heat pipes 132 and 134, which are formed in several layers, so as to further increase the efficiency of dissipating heat. In a more detailed example illustrated in FIG. 2, the heat-dissipating heat pipe unit 130 can include an outer loop heat pipe 132, which is placed on an outer side, and at least one inner loop heat pipe 134, which surrounds the inner circumference of the outer loop heat pipe 132 such that the inner loop heat pipe 134 can be kept separate from the outer loop heat pipe 132. In other words, an inner loop heat pipe 134 can be additionally placed on an inner side of the outer loop heat pipe 132, which is disposed in a limited space, and thus the loop heat pipes can be formed closed to one another in a limited space.

With this arrangement, the heat-dissipating heat pipe unit 130 being disposed in a limited space can obtain its maximum heat absorbing and heat releasing surface areas, thus significantly increasing the efficiency of dissipating heat. As such, the required heat releasing performance of the heat-dissipating heat pipe unit 130 can be achieved with a low speed heat-dissipating fan or no additional heat-dissipating fan. This results in a heat-dissipating device that can operate with little or no noise.

As described above, the heat-dissipating device 100 according to this embodiment is equipped with one or more wick-type heat pipes 122, which can quickly transport a large quantity of heat generated from a heat source, and oscillating capillary-type loop heat pipes 132 and 134, which can dissipate the heat transferred from the one or more wick-type heat pipes 122 through the large surface areas of the oscillating capillary-type loop heat pipes 132 and 134, and thus can provide a high efficiency in dissipating heat.

In the heat-dissipating device, in particular, the flow of heat is carried out only by heat pipes (wick-type and oscillating capillary-type). Thus, unlike the conventional pin-type heat-dissipating devices, this arrangement makes it possible to fundamentally solve the deterioration in dissipating heat that is caused by the congestion of heat transfer.

Furthermore, since the heat release is performed using a light-weight oscillating capillary-type heat pipe, the weight of the heat-dissipating device can be significantly reduced, compared to the conventional pin-type heat-dissipating devices. With this arrangement, a structurally reliable heat-dissipating device 100 can be implemented.

Hereinafter, a heat-dissipating device 200 according to a second disclosed embodiment of the present invention will be described in more detail with reference to the accompanying drawings.

Figure 5:
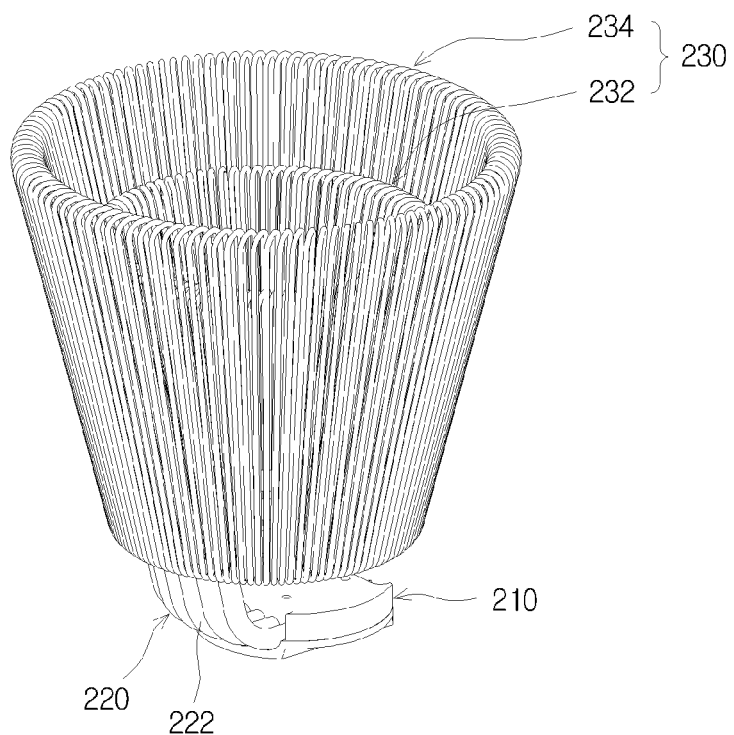
FIG. 5 is a perspective view illustrating a heat-dissipating device in accordance with a second disclosed embodiment of the present invention.
Figure 6:
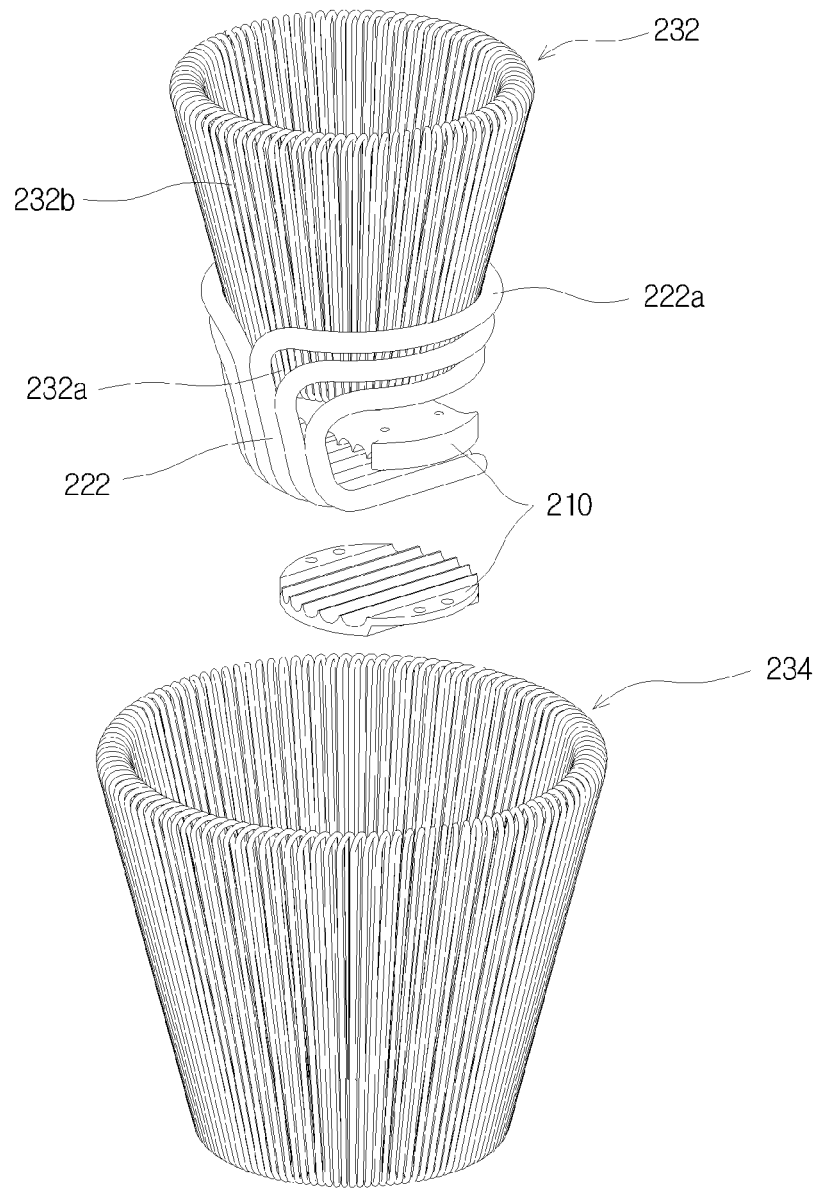
FIG. 6 is an exploded view illustrating a heat-dissipating device in accordance with the second disclosed embodiment of the present invention.

FIG. 5 is a perspective view illustrating the heat-dissipating device 200 in accordance with the second disclosed embodiment of the present invention, and FIG. 6 is an exploded view illustrating the heat-dissipating device 200 in accordance with the second disclosed embodiment of the present invention.

Compared to the first disclosed embodiment of the present invention, the heat-dissipating device 200 according to the second disclosed embodiment of the present invention is different in that the shape of a loop heat pipe 232 and the coupling structure of the loop heat pipe 232 and a heat pipe 222 are different from those of the first disclosed embodiment. Thus, certain detailed description of the first disclosed embodiment will be omitted when it is repeated, and the difference will be mainly described herein.

In the heat-dissipating device 200 according to the second embodiment of the present invention, the loop heat pipe 232 of a heat-dissipating heat pipe unit 230 is disposed in the form of a ring such that both ends of the loop face each other. With this arrangement, heat-dissipating portions 232b of the loop heat pipe 232 can be disposed in a radial direction.

Here, a ring-shaped radiator 222a, which may be coupled to an inner side or an outer side of ring-shaped loop heat pipes 232 and 234, can be formed on a heat pipe 222 of a heat-transferring heat pipe unit 220 so as to facilitate the coupling of the heat pipe 222 and the loop heat pipe 232, which is disposed in the shape of a ring.

In the heat-dissipating device 200 according to the second disclosed embodiment of the present invention, as illustrated in FIGS. 5 and 6, the heat-dissipating heat pipe unit 230 includes a pair of ring-shaped loop heat pipes 232 and 234 that are disposed in a double structure.

Figure 7:
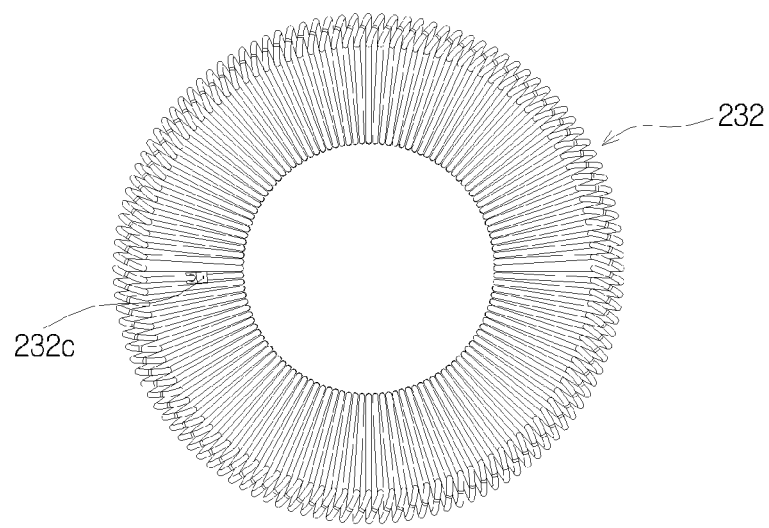
FIG. 7 is a plan view of a ring-shaped loop heat pipe in a heat-dissipating device in accordance with the second disclosed embodiment of the present invention.

FIG. 7 is a plan view of the ring-shaped loop heat pipe 232 in a heat-dissipating device in accordance with the second disclosed embodiment of the present invention.

As in the example illustrated in FIG. 7, the ring-shaped loop heat pipe 232 according to this embodiment is formed first by rolling a coil of pipe, which is shaped like a flat sheet, to form a cylinder and then by coupling both ends of the pipe through the use of a joint 232c to form a loop. With this arrangement, the heat-dissipating portions 232b performing the heat release are disposed in a radial direction from the center to the edge. This arrangement can allow the flow of air, which is essentially needed for heat release, to freely flow around the loop heat pipe 232, and thus the heat release can be performed with higher efficiency.

Here, the ring-shaped loop heat pipe 232 can be formed in such a way that the space between circles of the loop heat pipe 232 becomes wider from one side coupled to the ring-shaped radiator 222a to the other side releasing the heat. With this arrangement, the one side, coupled to the ring-shaped radiator 222a, of the ring-shaped loop heat pipe 232 can quickly absorb and transfer a large quantity of heat due to the compactly distanced heat pipes, where the other side of the ring-shaped loop heat pipe 232 can allow the flow of air to freely flow because of the widely distanced heat pipes, thereby easily releasing the large quantity of heat.

In the heat-dissipating device 200 according to the second disclosed embodiment of the present invention, as illustrated in FIGS. 5 and 6, the radiator 222a of the heat-transferring heat pipe unit 220 is formed in the shape of a cup holder. This arrangement can make it possible for a loop heat pipe 232 to be coupled to an inner side of the ring-shaped radiator 222a. Also, another loop heat pipe 234 can be coupled to an outer side of the ring-shaped radiator 222a.

Figure 8:
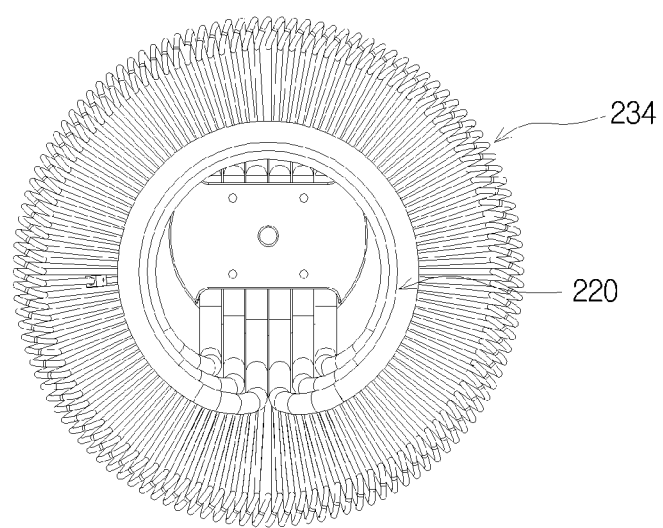
FIG. 8 is a plan view illustrating the connection between a heat pipe and a ring-shaped loop heat pipe placed on the outside of the heat pipe in a heat-dissipating device in accordance with the second disclosed embodiment of the present invention.

FIG. 8 is a plan view illustrating the connection between a heat pipe 222 and a ring-shaped loop heat pipe 234 placed on the outside of the heat pipe 222 in a heat-dissipating device according to the second disclosed embodiment of the present invention.

As in the example illustrated in FIG. 8, an outer surface of the ring-shaped radiator 222a can be coupled to an inner surface of the ring-shaped loop heat pipe 234. In this way, a pair of ring-shaped loop heat pipes 232 and 234 can be coupled to the heat pipe 222 through the inner and outer sides of the ring-shaped radiator 222a, maximizing the efficiency of dissipating heat.

Figure 9:
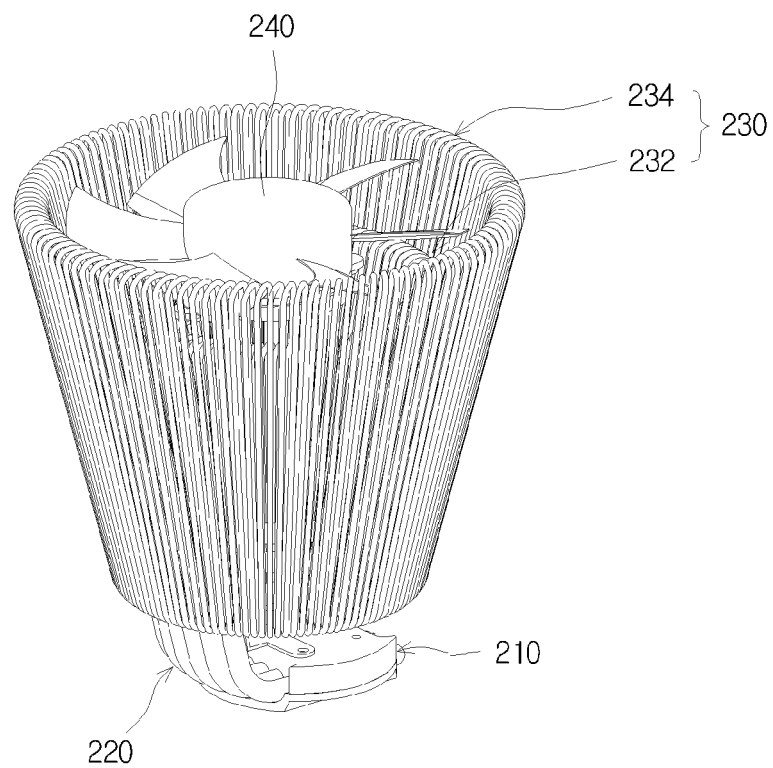
FIG. 9 is a perspective view of a heat-dissipating fan mounted on a heat-dissipating device in accordance with the second disclosed embodiment of the present invention.

Furthermore, as in the example illustrated in FIG. 9, a heat-dissipating fan 240, which moves a flow of air around and through the ring-shaped loop heat pipes 232 and 234, can be also included so as to further improve the efficiency of dissipating heat.

Compared to conventional heat-dissipating devices, the heat-dissipating device 200 according to this embodiment has a wider heat releasing surface area and rapid thermal conductivity, thus providing a high efficiency in dissipating heat without rotating the heat-dissipating fan 240 at a high speed and leading to quieter operation at a low speed.

While the present embodiment presents the heat-dissipating heat pipe unit 230 having the ring-shaped loop heat pipes 232 and 234, each of which is spiral-shaped and forms a loop, it shall be apparent that the heat-dissipating heat pipe unit 230 is not limited to this embodiment, and other various embodiments can be implemented. In a more detailed example, the heat-dissipating heat pipe unit 230 can be implemented to include a plurality of loop heat pipes that are disposed in a radical direction.

Hereinafter, a heat-dissipating device 300 according to a third disclosed embodiment of the present invention will be described in more detail with reference to the accompanying drawings.

Figure 10:
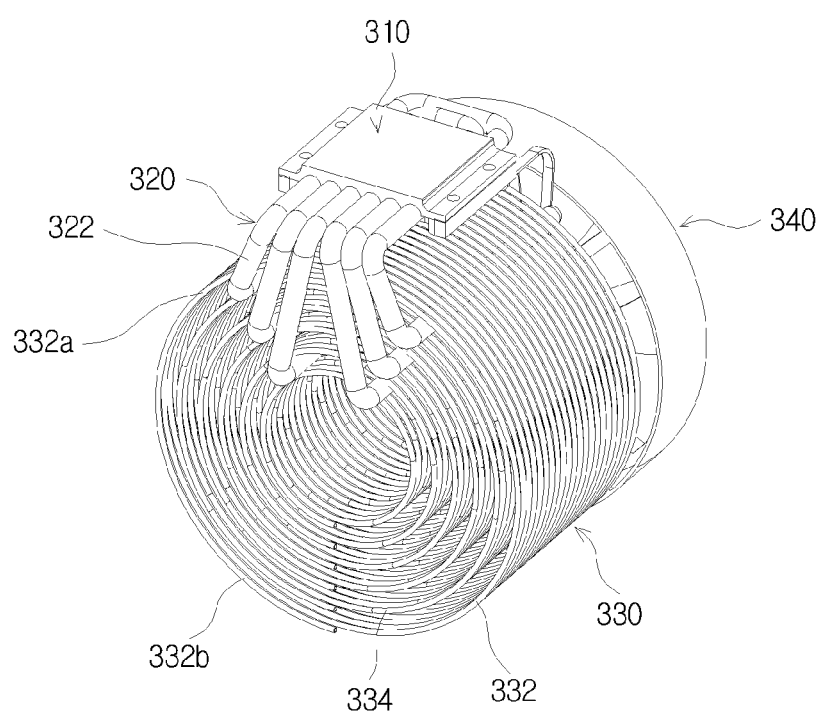
FIG. 10 is a perspective view illustrating a heat-dissipating device in accordance with a third disclosed embodiment of the present invention.
Figure 11:
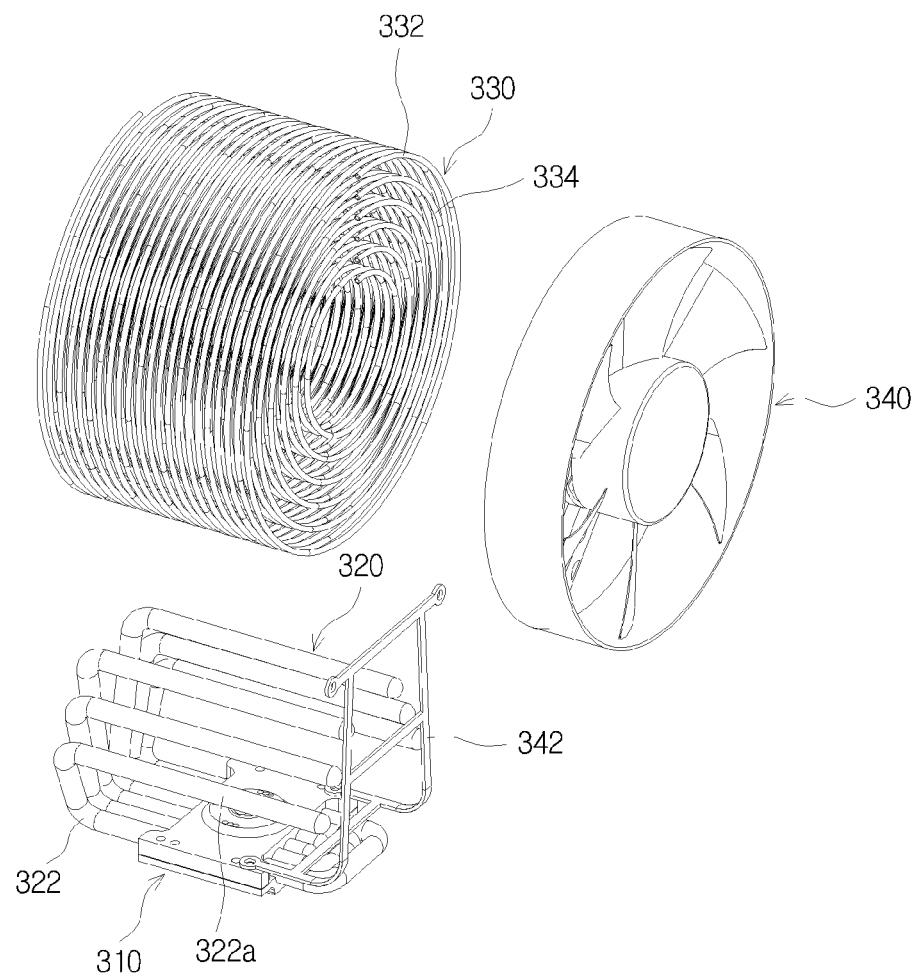
FIG. 11 is an exploded view of a heat-dissipating device in accordance with the third disclosed embodiment of the present invention.
Figure 12:
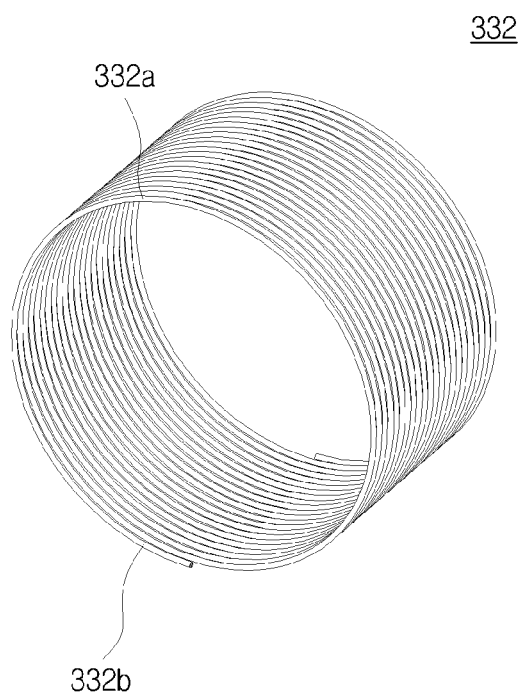
FIG. 12 is a perspective view of a loop heat pipe in a heat-dissipating device in accordance with the third disclosed embodiment of the present invention.

FIG. 10 is a perspective view illustrating the heat-dissipating device 300 in accordance with the third disclosed embodiment of the present invention, and FIG. 11 is an exploded view of the heat-dissipating device 300 in accordance with the third disclosed embodiment of the present invention, while FIG. 12 is a perspective view of a loop heat pipe 332 in the heat-dissipating device 300 in accordance with the third disclosed embodiment of the present invention.

Compared to the first disclosed embodiment of the present invention, the heat-dissipating device 300 according to the third disclosed embodiment of the present invention is different in that the coupling structure between loop heat pipes 332 and 334 and one or more heat pipes 322 is different from that of the first disclosed embodiment so as to provide better air circulation. Also, a heat-dissipating fan 34 is further included. Thus, certain detailed description of the first disclosed embodiment will be omitted when it is repeated, and the difference will be mainly described herein.

As in the example illustrated in FIG. 10, a heat transfer block 310 of the heat-dissipating device 300 according to the third embodiment of the present invention can be disposed adjacent and parallel to the outside edge of the outermost loop heat pipe 332. In this way, all the paths heading towards an inner side of the loop heat pipes 332 and 334 can be maintained with openings to every direction. This arrangement may allow air to better flow so as to cool the heat-dissipating portions 332b, thus improving the efficiency of dissipating heat.

In a more detailed example with reference to FIG. 12, the loop heat pipe 332 can be formed in the shape of a cylinder that is spiral-shaped, and thus the heat-dissipating portions 332b can be formed on the inside and outside surfaces of the cylinder-shaped loop heat pipes. Also, the cylinder-shaped loop heat pipes can be formed with the opening towards the lateral direction, allowing air, which is required for cooling the heat-dissipating portions 332b, to freely flow in the horizontal direction of the loop heat pipes 332 and 334.

Here, the heat transfer block 310 can be disposed adjacent to the outer edge of a loop heat pipe so as not to interfere with air flowing towards the inner sides of the loop heat pipes 332 and 334. Also, by disposing the heat transfer block 310 parallel to the outside edge of the loop heat pipe, one surface of the heat transfer block 310 can face towards the outside of the outside edge of the loop heat pipes 332 and 334. This arrangement may allow the heat transfer block 310 to be in contact with a heat source, for example, an electronic component. In this case, as illustrated in FIG. 11, one or more heat pipes 322 thermally connecting the heat transfer block 310 and the loop heat pipes 332 and 334 can be formed in such a way that the one or more heat pipes 322 can be coupled from one side of the heat transfer block 310 to inner sides of the loop heat pipes 332 and 334 and then coupled to inner surfaces of the loop heat pipes 332 and 334.

Furthermore, a heat-dissipating fan 34 can be included so as to further increase the heat dissipating efficiency, where the heat-dissipating fan 34 is disposed on one side of the heat-dissipating heat pipe unit 330 and allows air to circulate through an inner space of the loop heat pipes 332 and 334.

Compared to conventional heat-dissipating devices, the heat-dissipating device 300 according to this embodiment has a wider heat releasing surface area and rapid thermal conductivity, thus providing a high efficiency in dissipating heat without rotating the heat-dissipating fan 340 at a high speed and leading to quieter operation at a low speed.

Hereinafter, a heat-dissipating device 400 according to a fourth disclosed embodiment of the present invention will be described in more detail with reference to the accompanying drawings.

Figure 13:
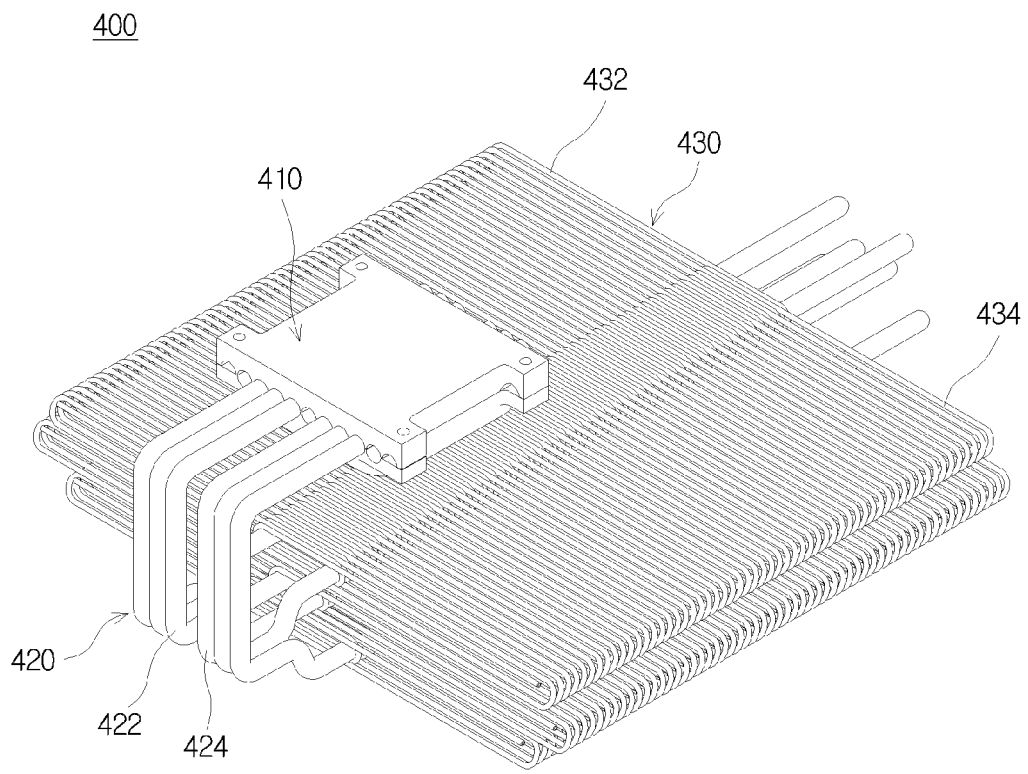
FIG. 13 is a perspective view illustrating a heat-dissipating device in accordance with a fourth disclosed embodiment of the present invention.
Figure 14:
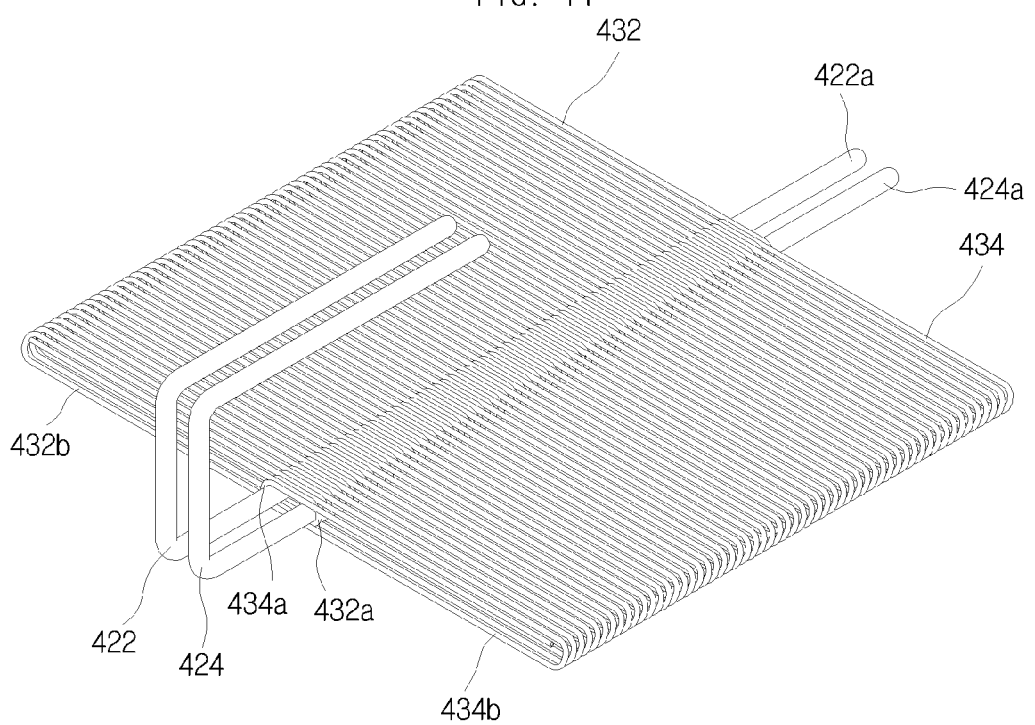
FIG. 14 is a perspective view illustrating a coupling structure of a heat pipe and a loop heat pipe in a heat-dissipating device in accordance with the fourth disclosed embodiment of the present invention.

FIG. 13 is a perspective view illustrating the heat-dissipating device 400 in accordance with the fourth disclosed embodiment of the present invention, while FIG. 14 is a perspective view illustrating a coupling structure of heat pipes 422 and 424 and loop heat pipes 432 and 434 in the heat-dissipating device 400 in accordance with the fourth disclosed embodiment of the present invention.

Compared to the first disclosed embodiment of the present invention, the heat-dissipating device 400 according to the fourth disclosed embodiment of the present invention is different in that loop heat pipes 432 and 434 having wider contacts with the heat pipes 422 and 424 are formed so as to efficiently dissipate a large quantity of heat generated in a large device. Thus, certain detailed description of the first disclosed embodiment will be omitted when it is repeated, and the difference will be mainly described herein.

The heat-dissipating device 400 according to this embodiment has a structure that can have maximum possible heat-receiving and heat-releasing surface areas of the loop heat pipes 432 and 434 so as to quickly release a large quantity of heat to the outside.

For this, as illustrated in FIG. 14, a heat-transferring heat pipe unit 420 includes at least one heat pipe 422 or 424 that has radiators 422a and 424a, which are arranged symmetrically, while a heat-dissipating heat pipe unit 430 includes a pair of loop heat pipes 432 and 434, which are coupled to the symmetrically arranged radiators 422a and 424a interchangeably and which are partly overlapped with each other. With this arrangement, heat-receiving portions 432a and 434a, which surround the radiators 422a and 424a, can be formed in a part of the pair of loop heat pipes 432 and 434 overlapping each other. Since the heat-receiving portions 432a and 434a cover the radiators 422a and 424a, a greater contact area between the heat-receiving portions 432a and 434a and the radiators 422a and 424a can be acquired. This arrangement may allow heat to quickly transfer from the heat pipes 422 and 424 to the loop heat pipes 432 and 434 without delay.

Furthermore, heat-dissipating portions 432b and 434b, which are shaped like wings spread from the heat-receiving portions 432a and 434a, have a large heat releasing surface area, allowing the wing-shaped heat-dissipating portions 432b and 434b to quickly release a large quantity of heat. Particularly, as in the example illustrated in FIG. 13, the heat-dissipating portions 432b and 434b can be arranged in multi-layers, thus further increasing the efficiency of dissipating heat.

As described above, the heat-dissipating device 400 according to this embodiment has an excellent ability to release a large quantity of heat, and thus can be used as a main heat-dissipating device in an electronic apparatus, for example, a computer.

Figure 15:
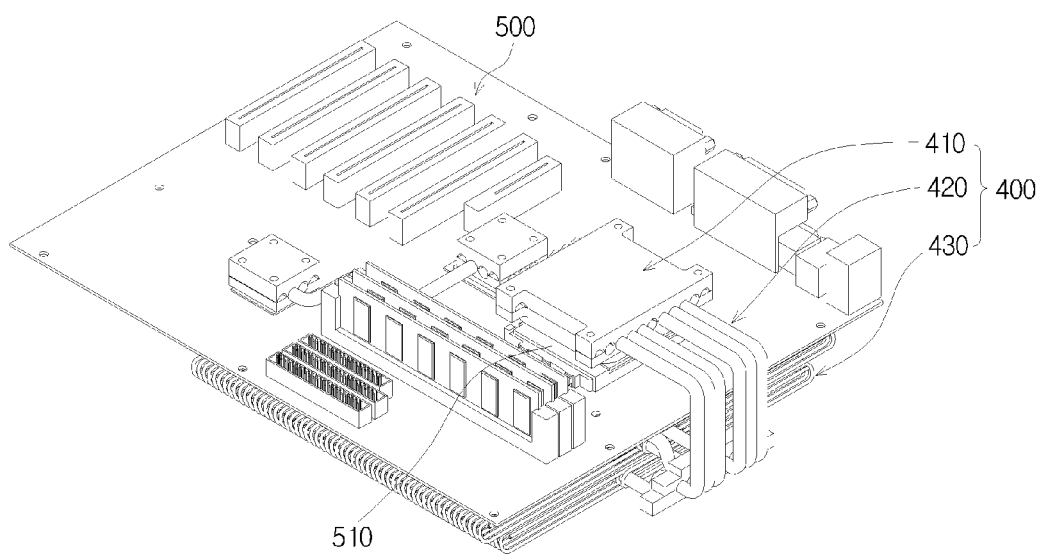
FIG. 15 is a perspective view illustrating the connection between a substrate and a heat-dissipating device in accordance with the fourth disclosed embodiment of the present invention.
Figure 16:
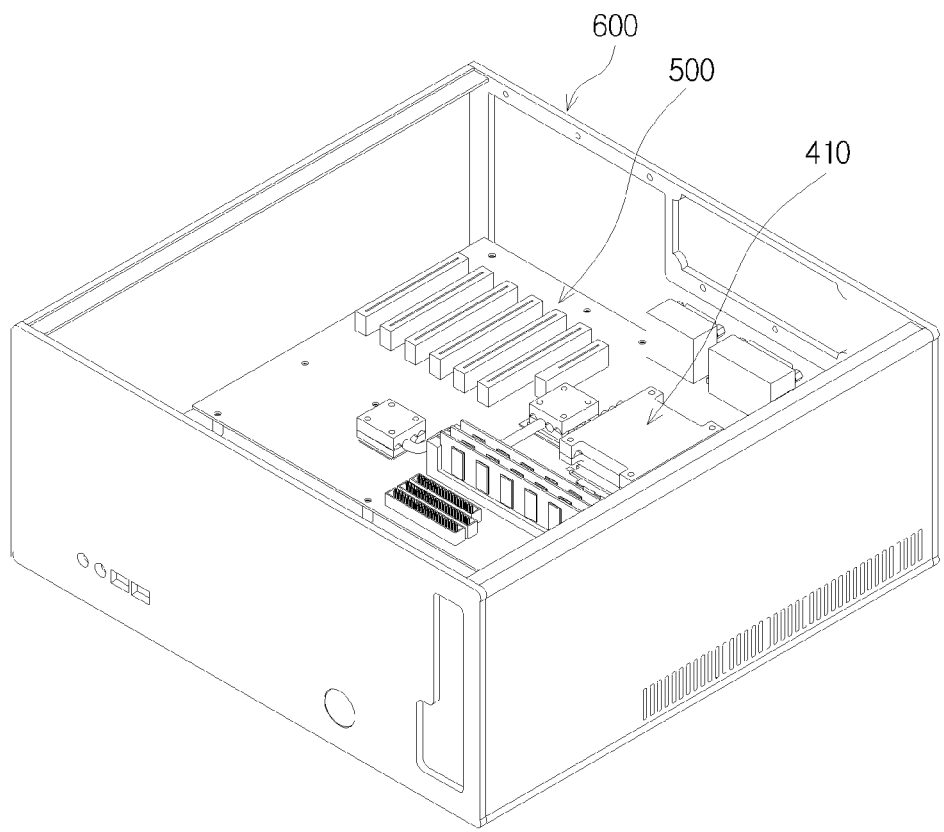
FIGS. 16 to 18 are perspective views illustrating an electronic apparatus equipped with a heat-dissipating device in accordance with the fourth disclosed embodiment of the present invention.
Figure 17:
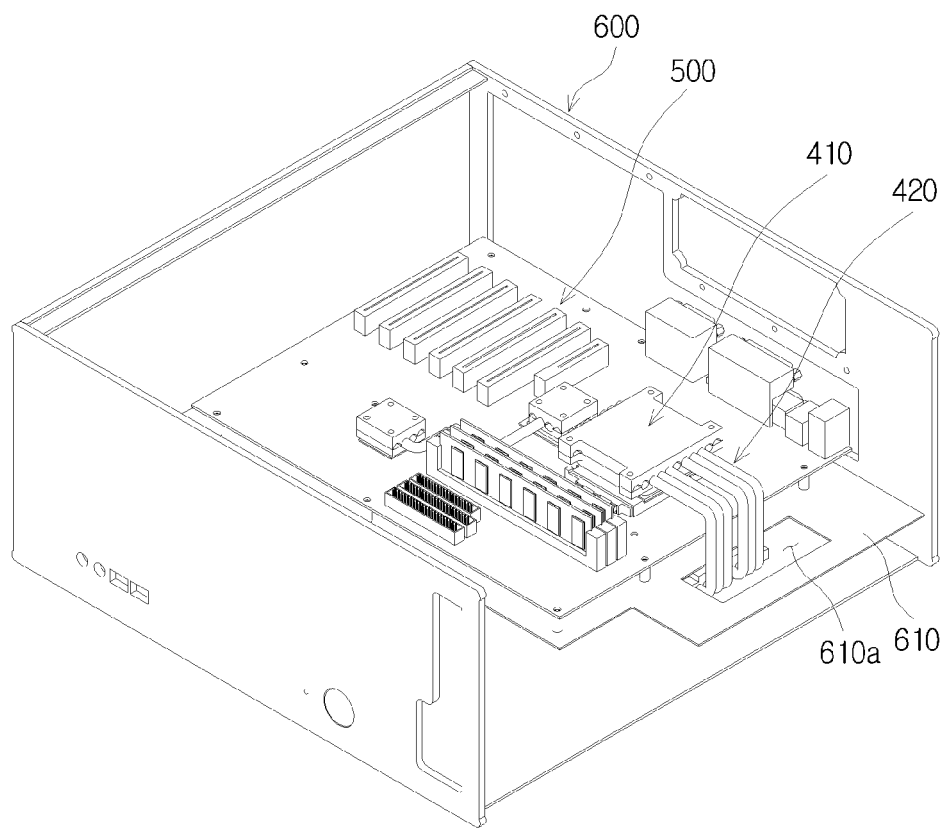
Figure 18:
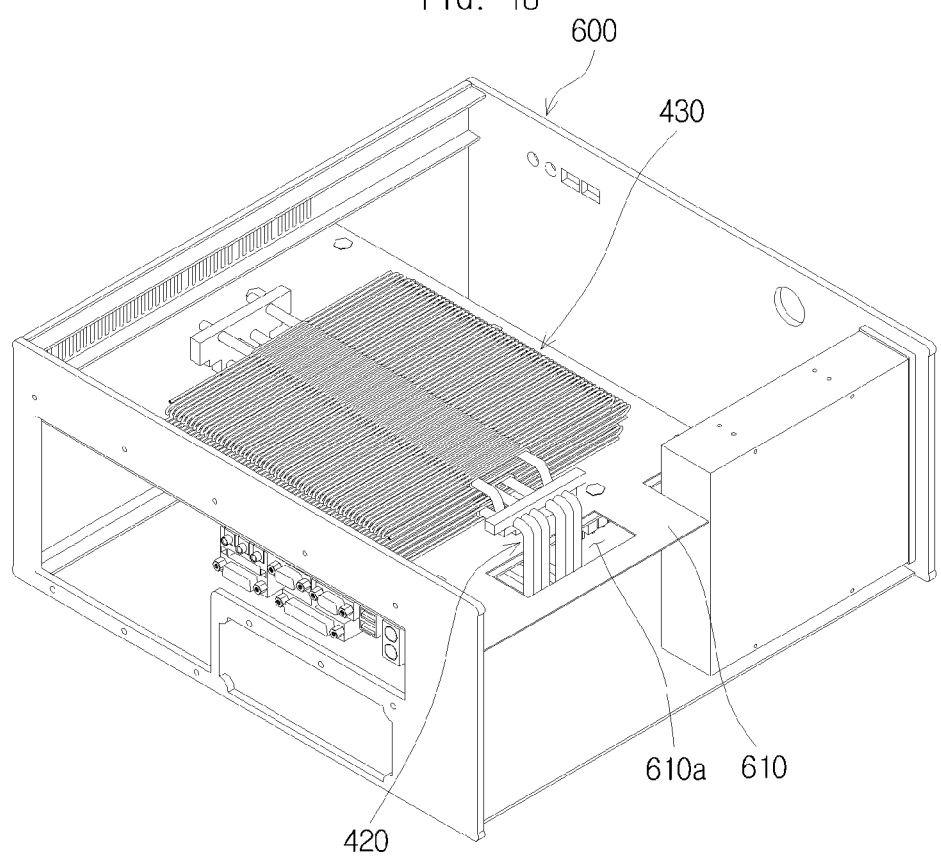

FIG. 15 is a perspective view illustrating a connection between a substrate 500 and the heat-dissipating device 400 in accordance with the fourth disclosed embodiment of the present invention, while FIGS. 16 to 18 are perspective views illustrating an electronic apparatus equipped with the heat-dissipating device 400 in accordance with the fourth disclosed embodiment of the present invention. In FIGS. 17 to 18, one side wall of a case 600 is removed so as to clearly illustrate the configuration of the heat-dissipating device 400.

An electronic apparatus equipped with the heat-dissipating device 400 according to the fourth disclosed embodiment of the present invention includes a substrate 500, in which a heat source 510 is mounted, a case 600, in which the substrate 500 is installed, and the heat-dissipating device 400.

As in the example illustrated in FIG. 15, a heat transfer block 410 of the heat-dissipating device 400 can be coupled to the substrate 500, in which a main heat source 510, for example, a CPU, of an electronic apparatus is mounted. Here, the heat-dissipating heat pipe unit 430 can be disposed on the other side of the substrate 500 having the heat source 510 mounted therein, so as to secure a large heat releasing surface area and avoid any interruption between electronic components installed in the substrate 500.

As in the example illustrated in FIGS. 16 to 18, an electronic apparatus according to this embodiment includes a case 600, in which the substrate 500 is installed. In particular, a partition 610, which divides the inner space of the case 600, can be installed in the case 600. Here, the substrate 500 can be installed on one surface of the partition 610, while the heat-dissipating heat pipe unit 430 is installed on the other surface. Here, the heat transfer block 410 installed on the substrate 500 and the heat-dissipating heat pipe unit 430 can be connected to each other by the heat-transferring heat pipe unit 420 through a through-hole 610a of the partition 610.

With this arrangement, a space housing the heat source 510 and another space housing the heat-dissipating heat pipe unit 430 can be separated from each other, and thus the heat released from the heat-dissipating device 400 can be prevented from being transferred back to the substrate 500. Also, by mounting the heat-dissipating heat pipe unit 430 on the other surface, which faces towards the outside, of the partition 610, the heat-dissipating portions 432b and 434b can be easily exposed to the outside air, thus increasing the efficiency of dissipating heat. Also, as illustrated in FIG. 18, a more stable and wider mounting surface can be secured for the heat-dissipating heat pipe unit 430.

As described above, an electronic apparatus according to the present embodiment has the heat-dissipating device 400 having a high efficiency in dissipating heat. Therefore, desirable heat releasing effects can be secured using no additional heat-dissipating fan or using a low-speed heat-dissipating fan, and thus a heat releasing system can be implemented with little or no noise.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

As such, many embodiments other than those set forth above can be found in the appended claims.

What is claimed is:

1. A heat-dissipating device comprising
a heat-transferring heat pipe unit having a wick type heat pipe, a wick being formed on an inner surface of the wick type heat pipe, a first working fluid being injected into the wick type heat pipe; and
a heat-dissipating heat pipe unit having an oscillating capillary type of a loop heat pipe, the loop heat pipe being formed as a capillary, a second working fluid being injected into the loop heat pipe,
wherein the wick type heat pipe comprises a radiator being disposed adjacent to a heat source and transporting heat transferred from the heat source to the loop heat pipe, and
the loop heat pipe comprises a heat-receiving portion and a heat-dissipating portion, the heat-receiving portion being thermally coupled to the radiator, the heat-dissipating portion releasing heat absorbed from the heat-receiving portion.

2. The heat-dissipating device of claim 1, further comprising a heat transfer block, the heat transfer block having a base, one surface of the base being in contact with a heat source, another surface of the base having a holding groove formed therein for the wick type heat pipe.

3. The heat-dissipating device according to claim 2, wherein: the loop heat pipe comprises:
an outer loop heat pipe, being disposed on an outer side of the heat-dissipating device, and
at least one inner loop heat pipe, surrounding an inner circumference of the outer loop heat pipe in such a way that the inner loop heat pipe is separated from the outer loop heat pipe; and the wick type heat pipe comprises at least one wick type heat pipe, being coupled to the inner and outer loop heat pipes.

4. The heat-dissipating device according to claim 2, wherein: the wick type heat pipe comprises at least one wick type heat pipe having radiators, the radiators being arranged symmetrically; and the loop heat pipe comprises a pair of loop heat pipes, the pair of loop heat pipes being coupled to the symmetrically arranged radiators interchangeably and being partly overlapped with each other.

5. The heat-dissipating device of claim 1, wherein the loop heat pipe has a spirally shaped structure.

6. The heat-dissipating device according to claim 5, wherein: the loop heat pipe comprises:
   an outer loop heat pipe, being disposed on an outer side of the heat-dissipating device, and
   at least one inner loop heat pipe, surrounding an inner circumference of the outer loop heat pipe in such a way that the inner loop heat pipe is separated from the outer loop heat pipe; and
   the wick type heat pipe comprises at least one wick type heat pipe, being coupled to the inner and outer loop heat pipes.

7. The heat-dissipating device of claim 5, wherein the loop heat pipe being disposed in a shape of a ring so as to form a radially disposed heat-dissipating portion.

8. The heat-dissipating device according to claim 5, wherein the loop heat pipe comprises a plurality of loop heat pipes being disposed in a radial direction.

9. The heat-dissipating device according to claim 5, wherein: the wick type heat pipe comprises at least one wick type heat pipe having radiators, the radiators being arranged symmetrically; and the loop heat pipe comprises a pair of loop heat pipes, the pair of loop heat pipes being coupled to the symmetrically arranged radiators interchangeably and being partly overlapped with each other.

10. The heat-dissipating device according to claim 1, wherein: the loop heat pipe comprises:
    an outer loop heat pipe, being disposed on an outer side of the heat-dissipating device, and
    at least one inner loop heat pipe, surrounding an inner circumference of the outer loop heat pipe in such a way that the inner loop heat pipe is separated from the outer loop heat pipe; and
    the wick type heat pipe comprises at least one wick type heat pipe, being coupled to the inner and outer loop heat pipes.

11. The heat-dissipating device of claim 10, wherein the inner and outer loop heat pipes are formed in a shape of a circular loop or a rectangular loop.

12. The heat-dissipating device of claim 11, further comprising a heat-dissipating fan disposed on one side of the heat-dissipating heat pipe unit and configured to enable circulation of air through an inner space of the loop heat pipe.

13. The heat-dissipating device of claim 1, wherein the loop heat pipe being disposed in a shape of a ring so as to form a radially disposed heat-dissipating portion.

14. The heat-dissipating device of claim 13, wherein: the wick type heat pipe comprises a ring-shaped radiator; and the loop heat pipe comprises a pair of ring-shaped loop heat pipes being coupled to an inner side and an outer side of the ring-shaped radiator, respectively.

15. The heat-dissipating device of claim 14, wherein the pair of ring-shaped loop heat pipes are formed in such a way that a distance between circles of the ring-shaped loop heat pipes become wider from one side to another side, the one side being coupled to the ring-shaped radiator.

16. The heat-dissipating device according to claim 1, wherein the loop heat pipe comprises a plurality of loop heat pipes being disposed in a radial direction.

17. The heat-dissipating device according to claim 1, wherein: the wick type heat pipe comprises at least one wick type heat pipe having radiators, the radiators being arranged symmetrically; and the loop heat pipe comprises a pair of loop heat pipes, the pair of loop heat pipes being coupled to the symmetrically arranged radiators interchangeably and being partly overlapped with each other.

18. An electronic apparatus comprising:
    a substrate, the substrate having a heat source mounted thereon;
    a case, the case having the substrate installed therein; and
    a heat-dissipating device according to claim 17, the heat-dissipating device being coupled to the heat source.

19. The electronic apparatus of claim 18, wherein the heat-transferring heat pipe unit of the heat-dissipating device comprises multiple pairs of radiators, and the loop heat pipe of the heat-dissipating device comprises multiple pairs of unit loop heat pipes being arranged in parallel.

20. The electronic apparatus of claim 18, further comprising a partition, the partition being installed in the case so as to divide an inner space of the case, the substrate being installed on one surface of the partition, the heat-dissipating heat pipe unit being installed on another surface of the partition.

* * * * *